United States Patent
Khandekar et al.

(10) Patent No.: US 8,578,249 B2
(45) Date of Patent: *Nov. 5, 2013

(54) LDPC ENCODING AND DECODING OF PACKETS OF VARIABLE SIZES

(75) Inventors: Aamod Khandekar, San Diego, CA (US); Thomas Richardson, South Orange, NJ (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/413,277

(22) Filed: Mar. 6, 2012

(65) Prior Publication Data

US 2012/0166914 A1 Jun. 28, 2012

Related U.S. Application Data

(63) Continuation of application No. 12/018,959, filed on Jan. 24, 2008.

(60) Provisional application No. 60/886,496, filed on Jan. 24, 2007.

(51) Int. Cl.
*H03M 13/00* (2006.01)

(52) U.S. Cl.
USPC ........... 714/779; 714/758; 714/800; 714/752; 714/781; 714/801; 714/804; 714/751; 714/790

(58) Field of Classification Search
None
See application file for complete search history.

(56) References Cited

U.S. PATENT DOCUMENTS

| | | | |
|---|---|---|---|
| 6,567,465 B2 | 5/2003 | Goldstein et al. | |
| 6,633,859 B1 | 10/2003 | Farlow et al. | |
| 6,957,375 B2 * | 10/2005 | Richardson | 714/752 |
| 6,961,888 B2 * | 11/2005 | Jin et al. | 714/752 |
| 7,581,157 B2 | 8/2009 | Oh et al. | |
| 7,702,986 B2 | 4/2010 | Bjerke et al. | |
| 7,934,146 B2 | 4/2011 | Stolpman | |
| 2004/0187129 A1 * | 9/2004 | Richardson | 718/100 |
| 2005/0078765 A1 * | 4/2005 | Jeong et al. | 375/267 |
| 2005/0154958 A1 | 7/2005 | Xia et al. | |

(Continued)

FOREIGN PATENT DOCUMENTS

| EP | 1656737 A1 | 5/2006 |
|---|---|---|
| KR | 20060048403 A | 5/2006 |

(Continued)

OTHER PUBLICATIONS

3GPP2 C.S0084-001-0 v1.0; "3rd Generation Partnership Project 2; Physical Layer for Ultra Mobile Broadband (UMB) Air Interface Specification," 3GPP2 C.S0084-001-0 version 1.0, Apr. 5, 2007.

(Continued)

*Primary Examiner* — John Trimmings
(74) *Attorney, Agent, or Firm* — Eric Ho

(57) ABSTRACT

Techniques to support low density parity check (LDPC) encoding and decoding are described. An apparatus includes at least one processor and a memory coupled to the at least one processor. The at least one processor is configured to encode or decode a packet based on a base parity check matrix and a set of lifting values. In a particular embodiment, the set of lifting values is limited to lifting values that are each a different power of two. The memory is configured to store parameters associated with the base parity check matrix.

42 Claims, 9 Drawing Sheets

(56) References Cited

U.S. PATENT DOCUMENTS

| | | | |
|---|---|---|---|
| 2005/0246617 A1 | 11/2005 | Kyung et al. | |
| 2005/0283708 A1* | 12/2005 | Kyung et al. | 714/758 |
| 2005/0283709 A1* | 12/2005 | Kyung et al. | 714/758 |
| 2006/0020868 A1* | 1/2006 | Richardson et al. | 714/752 |
| 2007/0022354 A1* | 1/2007 | Yu et al. | 714/755 |
| 2007/0101246 A1 | 5/2007 | Kyung et al. | |
| 2007/0283219 A1* | 12/2007 | Park et al. | 714/758 |
| 2007/0283221 A1* | 12/2007 | Kyung et al. | 714/758 |
| 2008/0178065 A1 | 7/2008 | Khandekar et al. | |
| 2008/0288846 A1 | 11/2008 | Kyung et al. | |
| 2010/0077275 A1* | 3/2010 | Yu et al. | 714/752 |
| 2010/0211847 A1* | 8/2010 | Livshitz et al. | 714/752 |

FOREIGN PATENT DOCUMENTS

| | | |
|---|---|---|
| RU | 2007042 C1 | 1/1994 |
| WO | WO02103631 | 12/2002 |
| WO | WO2005036774 A1 | 4/2005 |
| WO | WO2006014742 A2 | 2/2006 |
| WO | WO2006019217 A1 | 2/2006 |
| WO | WO2006039801 A1 | 4/2006 |

OTHER PUBLICATIONS

Anonymous: "Physical Layer for Ultra Mobile Broadband (UMB) Air Interface Specification", 3GPP2 Specifications, [Online] Aug. 2007, pp. 2-41-2-59, XP002501071, Retrieved from the internet: URL:http://www.3gpp2.org/public_html/specs/C.S0084-001_v2.0_070904.pdf.

International Search Report—PCT/US08/051961, International Search Authority—European Patent Office, Nov. 19, 2008.

Okamura T. et al., "Designing LDCP Codes using cyclic shifts," Proceedings 2003 IEEE International Symposium on Information Theory. ISIT 03. Yokohama, Japan, Jun. 29, 2003, p. 151.

Richardson T. et al., "LDPC Coding Proposal for LBC", 3GPP2-Drafts, Jan. 30, 2007, XP040476936, ftp://ftp.3gpp2.org/TSGC/Working/2007/2007- 02- Seoul/TSG-C-2007-02- Seoul/WG3/LDPC%20Ad%20Hoc%20Call,%202007.01.30/C30- 20070130-008_QCOM_LGE_LDPC_Proposal_for_LBC.pdf.

Richardson TJ et al., "Efficient encoding of low-density parity-check codes," IEEE Transactions on Information Theory, US, vol. 47, No. 2, Feb. 1, 2001, pp. 638-656.

Taiwan Search Report—TW097102766—TIPO—Jun. 5, 2011.

Translation of Office Action in Korean application 10-2009-7017639 corresponding to U.S. Appl. No. 12/018,959, citing KR20060048403 and 3GPP2_TSGC_WG3_Richardson_year_2006 dated Mar. 15, 2011.

Written Opinion—PCT/US08/051961, International Search Authority—European Patent Office, Nov. 19, 2008.

Zhiyong He et al., "Capacity-Approaching LDCP codes with low error floors for high-speed digital communications," Communications, 2006 23rd Biennial Symposium on Kingston, ON, Canada, May 29, 2006, pp. 10-13.

Dorot, V., et al., "An Explanatory Dictionary of Modern Computer Terms," 2nd Edition, BHV—Petersburg Publishers, Saint Petersburg, 2001, 'Program Product' on p. 339.

Pandya N. et al., "Variable-rate capacity-approaching LDPC codes for HF communications," Proc. of 10th IET International Conference on Ionospheric Radio Systems and Techniques, IRST, pp. 123-127, Jul. 2006.

Richardson T., et al., "LDPC Proposal Update" ,3GPP2-Drafts, Dec. 18, 2006, XP040476671, ftp://ftp.3gpp2.org/TSGC/Working/2007/2007-01- Vancouver/TSG-C-2007-01- Vancouver/WG3/Distribution%202006.12.18/C30- 20061218- 004_QCOM_LDPC_proposal_update.pdf.

Classon, B., et al. "LDPC coding for OFDMA PHY," IEEE 802.16 Broadband Wireless Access Working Group, IEEE C802.16e-04/278r1, Aug. 17, 2004.

Alcatel-Lucent, et al., "LDPC Coding Proposal for LBC", 3GPP2-Drafts, C30-20070212-034R1, Feb. 12, 2007, XP040476886.

European Search Report—EP12190674—Search Authority—The Hague—Feb. 5, 2013.

* cited by examiner

LDPC ENCODING AND DECODING OF PACKETS OF VARIABLE SIZES

CROSS-REFERENCE TO RELATED APPLICATIONS

This application claims priority from and is a continuation of U.S. patent application Ser. No. 12/018,959, filed Jan. 24, 2008, which claims priority to U.S. Provisional Application No. 60/886,496, filed Jan. 24, 2007, the contents of both of which are expressly incorporated by reference herein in their entirety.

BACKGROUND

I. Field

The present disclosure relates generally to communication, and more specifically to techniques for encoding and decoding data.

II. Background

In a communication system, a transmitter may encode a packet of data to obtain code bits, interleave the code bits, and map the interleaved bits to modulation symbols. The transmitter may then process and transmit the modulation symbols via a communication channel. The communication channel may distort the data transmission with a particular channel response and further degrade the data transmission with noise and interference. A receiver may obtain received symbols, which may be distorted and degraded versions of the transmitted modulation symbols. The receiver may process the received symbols to recover the transmitted packet.

The encoding by the transmitter may allow the receiver to reliably recover the transmitted packet with the degraded received symbols. The transmitter may perform encoding based on a forward error correction (FEC) code that generates redundancy in the code bits. The receiver may utilize the redundancy to improve the likelihood of recovering the transmitted packet.

Various types of FEC code may be used for encoding. Some common types of FEC code include convolutional code, Turbo code, and low density parity check (LDPC) code. A convolutional code or a Turbo code can encode a packet of k information bits and generate a coded packet of approximately r times k code bits, where 1/r is the code rate of the convolutional or Turbo code. A convolutional code can readily encode a packet of any size by passing each information bit through an encoder that can operate on one information bit at a time. A Turbo code can also support different packet sizes by employing two constituent encoders that can operate on one information bit at a time and a code interleaver that can support different packet sizes. An LDPC code may have better performance than convolutional and Turbo codes under certain operating conditions. However, an LDPC code is typically designed for a particular packet size and may not be able to readily accommodate packets of varying sizes.

There is therefore a need in the art for techniques to support efficient LDPC encoding and decoding of packets of varying sizes.

SUMMARY

Techniques to support LDPC encoding and decoding are described herein. In an aspect, LDPC encoding and decoding of packets of varying sizes may be efficiently supported with a set of base parity check matrices of different dimensions and a set of lifting values of different powers of two. A base parity check matrix G of dimension $m_B \times n_B$ may be used to encode a packet of up to $k_B = n_B - m_B$ information bits to obtain a coded packet or codeword of $n_B$ code bits. This base parity check matrix G may be "lifted" by a lifting value of L to obtain a lifted parity check matrix H of dimension $L \cdot m_B \times L \cdot n_B$. The lifted parity check matrix H may be used to encode a packet of up to $L \cdot k_B$ information bits to obtain a codeword of $L \cdot n_B$ code bits. A wide range of packet sizes may be supported with a relatively small set of base parity check matrices and a relatively small set of lifting values. The lifting may also enable efficient parallel encoding and decoding, which may improve performance. Furthermore, the lifting may reduce description complexity for large LDPC codes.

In another aspect, a single set of cyclic shift values for non-zero elements of a base parity check matrix for one lifting value (e.g., the maximum lifting value) may be used to generate cyclic shift values for all other lifting values of different powers of two. In yet another aspect, cyclic shift values of s and s+L/m may be selected for two non-zero elements in a column of a base parity check matrix having at least three non-zero elements, where s is an arbitrary value and m is a power of two. In one design, m is equal to four, and the cyclic shift values for the two non-zero elements are s and s+L/4. These cyclic shift values may simplify encoding and decoding.

Various aspects and features of the disclosure are described in further detail below.

BRIEF DESCRIPTION OF THE DRAWINGS

FIG. 7 shows another representation of the lifted parity check matrix.

DETAILED DESCRIPTION

The techniques described herein may be used for various applications such as communication, computing, networking, etc. The techniques may also be used for various communication systems including wireless systems, wireline systems, etc. For clarity, certain aspects of the techniques are described below for a wireless communication system.

Figure 1:
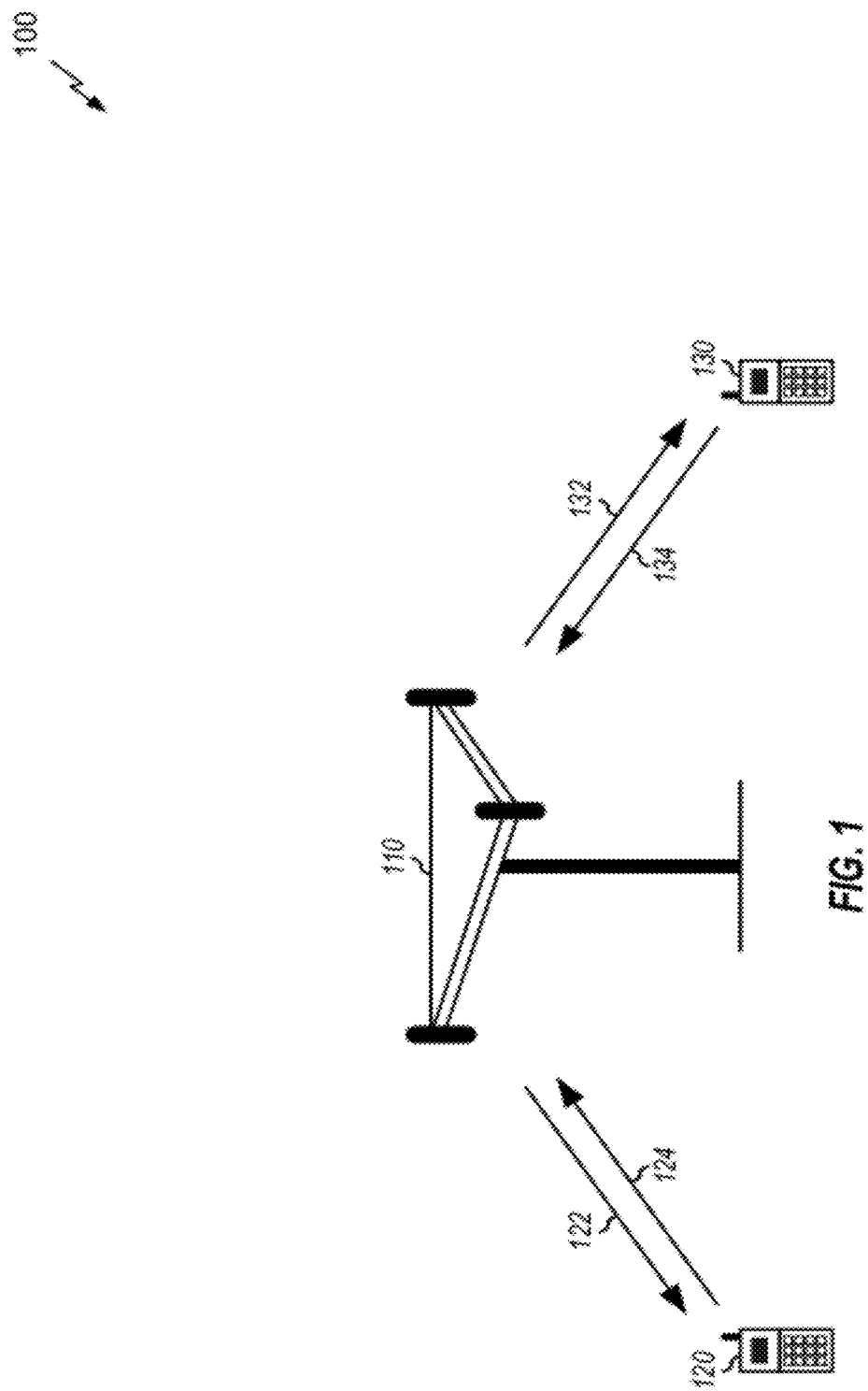
FIG. 1 shows a wireless communication system.

FIG. 1 shows a wireless communication system 100, which may also be referred to as an access network (AN). For simplicity, only one base station 110 and two terminals 120 and 130 are shown in FIG. 1. A base station is a station that communicates with the terminals and may also be referred to as an access point, a Node B, an evolved Node B, etc. A terminal may be stationary or mobile and may also be referred to as an access terminal (AT), a mobile station, a user equipment, a subscriber unit, a station, etc. A terminal may be a cellular phone, a personal digital assistant (PDA), a wireless communication device, a wireless modem, a handheld device, a laptop computer, a cordless phone, etc. A terminal may communicate with a base station on the forward and/or reverse links at any given moment. The forward link (or downlink) refers to the communication link from the base stations to the terminals, and the reverse link (or uplink) refers to the communication link from the terminals to the base stations. In FIG. 1, terminal 120 may receive data from base station 110 via forward link 122 and may transmit data via reverse link 124. Terminal 130 may receive data from base station 110 via forward link 132 and may transmit data via reverse link 134. The techniques described herein may be used for transmission on the forward link as well as the reverse link.

Figure 2:
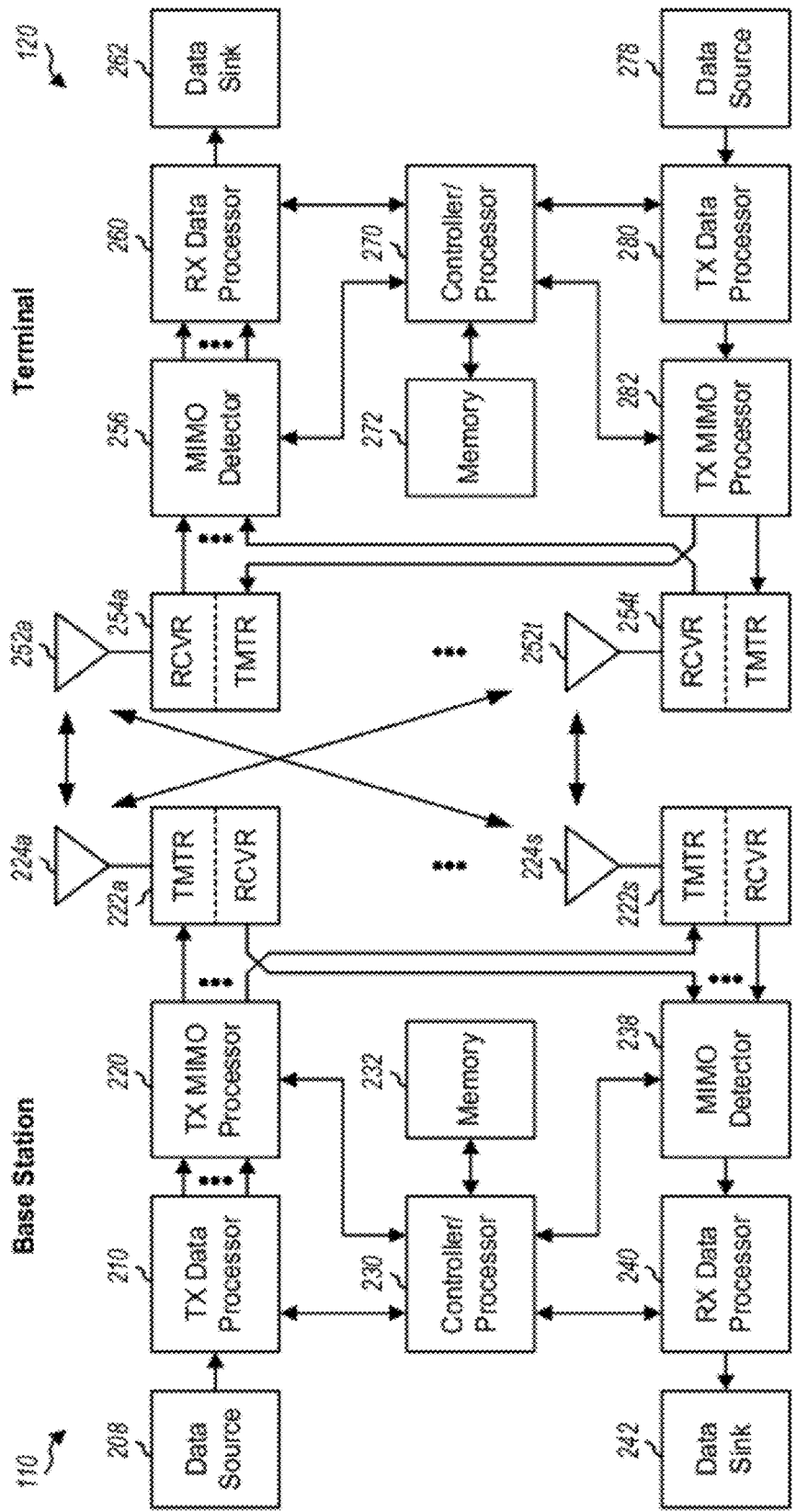
FIG. 2 shows a block diagram of a base station and a terminal.

FIG. 2 shows a block diagram of a design of base station 110 and terminal 120 in FIG. 1. In this design, base station 110 is equipped with S antennas 224a through 224s, and terminal 120 is equipped with T antennas 252a through 252t, where in general S≥1 and T≥1.

On the forward link, at base station 110, a transmit (TX) data processor 210 may receive a packet of data from a data source 208, process (e.g., encode, interleave, and symbol map) the packet based on a packet format, and provide data symbols, which are modulation symbols for data. A TX MIMO processor 220 may multiplex the data symbols with pilot symbols, perform spatial processing (e.g., precoding) if applicable, and provide S output symbol streams to S transmitters (TMTR) 222a through 222s. Each transmitter 222 may process its output symbol stream (e.g., for OFDM) to obtain an output chip stream. Each transmitter 222 may further condition (e.g., convert to analog, filter, amplify, and upconvert) its output chip stream and generate a forward link signal. S forward link signals from transmitters 222a through 222s may be transmitted via S antennas 224a through 224s, respectively.

At terminal 120, T antennas 252a through 252t may receive the forward link signals from base station 110, and each antenna 252 may provide a received signal to a respective receiver (RCVR) 254. Each receiver 254 may process (e.g., filter, amplify, downconvert, and digitize) its received signal to obtain samples, further process the samples (e.g., for OFDM) to obtain received symbols, and provide the received symbols to a MIMO detector 256. MIMO detector 256 may perform MIMO detection on the received symbols, if applicable, and provide detected symbols. A receive (RX) data processor 260 may process (e.g., symbol demap, deinterleave, and decode) the detected symbols and provide decoded data to a data sink 262. In general, the processing by MIMO detector 256 and RX data processor 260 is complementary to the processing by TX MIMO processor 220 and TX data processor 210 at base station 110.

On the reverse link, at terminal 120, a packet of data may be provided by data source 278 and processed (e.g., encoded, interleaved, and symbol mapped) by a TX data processor 280. The data symbols from TX data processor 280 may be multiplexed with pilot symbols and spatially processed by a TX MIMO processor 282, and further processed by transmitters 254a through 254t to generate T reverse link signals, which may be transmitted via antennas 252a through 252t. At base station 110, the reverse link signals from terminal 120 may be received by antennas 224a through 224s, processed by receivers 222a through 222s, detected by a MIMO detector 238, and further processed by an RX data processor 240 to recover the packet sent by terminal 120.

Controllers/processors 230 and 270 may direct the operation at base station 110 and terminal 120, respectively. Controllers/processors 230 and 270 may determine the sizes of packets to be transmitted and/or received. Controllers/processors 230 and 270 may then direct encoding by TX data processors 210 and 280, respectively, and/or direct decoding by RX data processors 240 and 260, respectively. Memories 232 and 272 may store data and program codes for base station 110 and terminal 120, respectively.

In an aspect, LDPC encoding or decoding of packets of varying sizes may be efficiently supported with a set of base parity check matrices of different dimensions and a set of lifting values of different powers of two. The base parity check matrices may be for base LDPC codes of different ($k_B$, $n_B$) rates, where $k_B$ is the number of information bits and $n_B$ is the number of code bits. Each base LDPC code may be lifted as described below to obtain a set of lifted LDPC codes, which may be used to encode or decode packets of different sizes. A range of packet sizes may be supported by lengthening or shortening LDPC codes by adding or removing parity bits in a base graph.

An LDPC code may be defined by a sparse parity check matrix having relatively few non-zero/non-null elements and mostly zero/null elements. The parity check matrix defines a set of linear constraints on code bits and may be represented in the form of a Tanner graph.

Figures 3, 4:
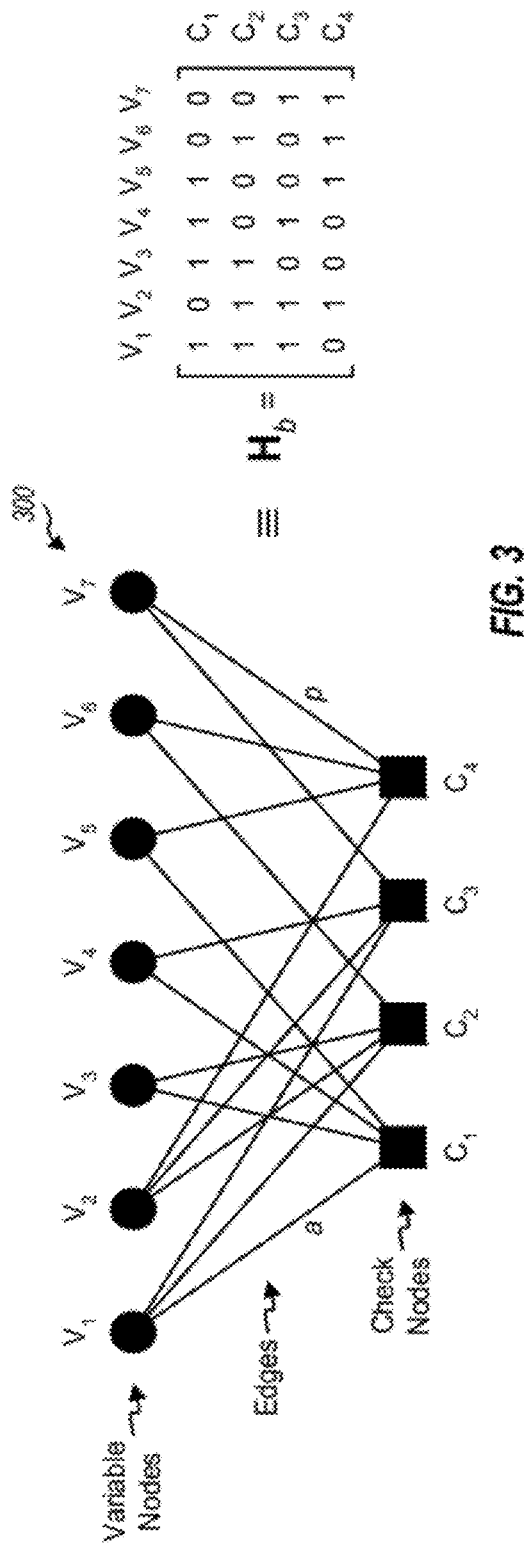
FIG. 3 shows a Tanner graph for an example LDPC code.
FIG. 4 shows lifting of a base parity check matrix.

FIG. 3 shows a Tanner graph 300 for an example base LDPC code. In this example, Tanner graph 300 includes seven variable nodes $V_1$ through $V_7$ represented by seven circles and four check nodes $C_1$ through $C_4$ represented by four squares. Each variable node represents a code bit, which may be either transmitted or punctured (i.e., not transmitted). The seven code bits for variable nodes $V_1$ through $V_7$ form a codeword. Each check node represents a constraint, and the four check nodes $C_1$ through $C_4$ represented four constraints that define the base LDPC code. The variable nodes are connected to the check nodes via edges. In this example, 16 edges a through p connect the seven variable nodes to the four check nodes. The degree of a node is equal to the number of edges connected to that node. In this example, variable nodes $V_1$ and $V_2$ are degree 3 nodes, and variable nodes $V_3$ through $V_7$ are degree 2 nodes. For each check node, all code bits at the variable nodes coupled to that check node are constrained to sum to 0 (modulo-2).

FIG. 3 also shows a base parity check matrix $H_b$ corresponding to Tanner graph 300. $H_b$ includes seven columns for the seven variable nodes $V_1$ through $V_7$ and four rows for the four check nodes $C_1$ through $C_4$. Each column of $H_b$ includes a 1 element for each edge connected to the variable node corresponding to that column. For example, column 1 includes three is in rows 1, 2 and 3 for the three edges a, b and c connecting the corresponding variable node $V_1$ to check nodes $C_1$, $C_2$ and $C_3$ in Tanner graph 300. Each remaining column of $H_b$ includes two or three is for two or three edges connecting the corresponding variable node to two or three check nodes.

The constraints for an LDPC code may be expressed in matrix form as:

$$0 = Hx, \qquad \text{Eq (1)}$$

where H is an $m_B \times n_B$ parity check matrix for the LDPC code,
x is an $n_B \times 1$ column vector of $n_B$ code bits for a codeword, and
0 is a column vector of all zeros.

For simplicity, 0 may denote a vector or a matrix of all zeros in the description below. The matrix multiplication in equation (1) is with modulo-2 arithmetic. A codeword is considered as valid if the constraints in equation (1) are satisfied. The encoding of a packet based on the parity check matrix H to obtain the codeword x is described below.

A small base LDPC code may be lifted to obtain a larger lifted LDPC code. The lifting may be achieved by replacing each non-zero element in a base parity check matrix for the base LDPC code with an L×L permutation matrix to obtain a lifted parity check matrix for the lifted LDPC code. This results in L copies of a base graph for the base LDPC code being generated. The permutation matrices determine how the variable nodes in each graph copy are connected to the check nodes in the L graph copies.

FIG. 4 shows an example of lifting for the base parity check matrix $H_b$ shown in FIG. 3. Each non-zero element of $H_b$ (which corresponds to an edge in the Tanner graph) is replaced with an L×L permutation matrix σ to obtain a lifted parity check matrix $H_1$. The 16 permutation matrices for the 16 non-zero elements of $H_b$ are denoted as $σ_a$ through σ, where $σ_a$ is the permutation matrix for edge a in FIG. 3.

The permutation matrices may be defined in various manners. In one design, a set of permutation matrices may be predefined, and the permutation matrix for each non-zero element of the base parity check matrix may be selected from this predefined set of permutation matrices. In another design, cyclic permutation matrices are used for the non-zero elements of the base parity check matrix.

Figure 5:
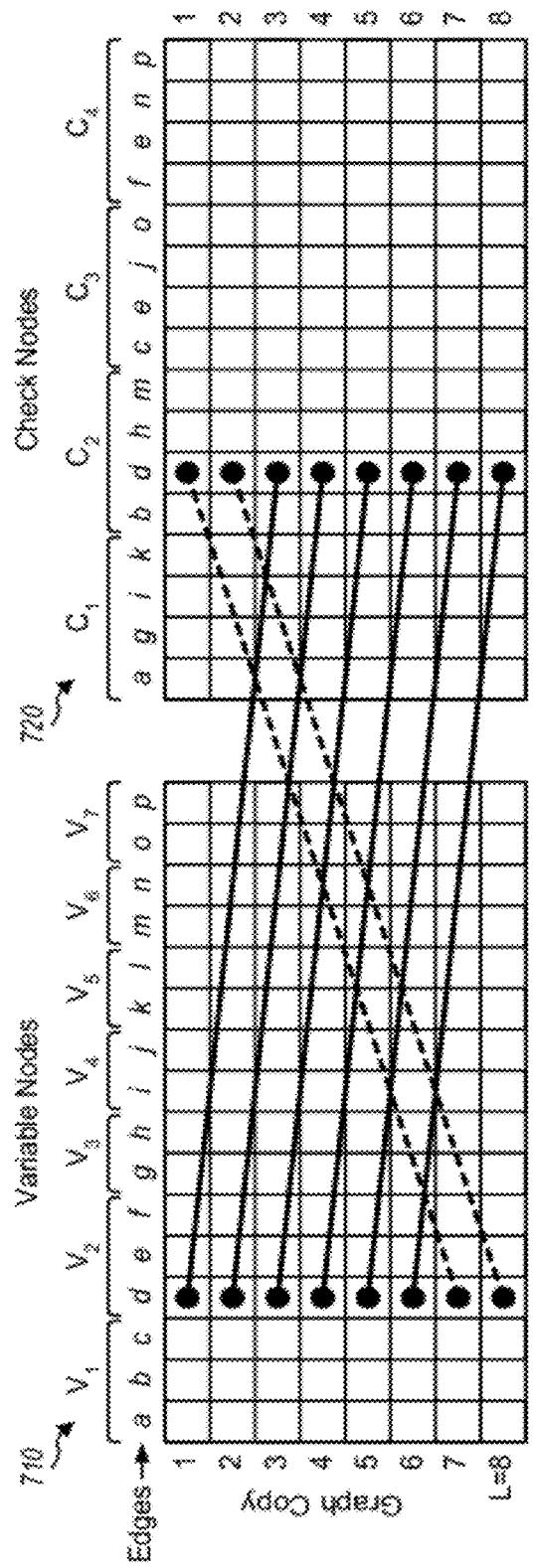
FIG. 5 shows a set of four cyclic permutation matrices.

FIG. 5 shows a set of four cyclic permutation matrices for L=4. In this example, each permutation matrix has dimension of 4×4. Permutation matrix $σ_0$ for a cyclic shift value of zero is equal to an identity matrix I having ones along the diagonal and zeros elsewhere. Permutation matrix $σ_1$ for a cyclic shift value of one has the bottommost row of the identity matrix moved or shifted to the top. Permutation matrix $σ_2$ for a cyclic shift value of two has the two bottommost rows of the identity matrix moved to the top. Permutation matrix $σ_3$ for a cyclic shift value of three has the three bottommost rows of the identity matrix moved to the top. In general, an L×L permutation matrix $σ_s$ for a cyclic shift value of s has the s bottommost rows of the identity matrix moved to the top, where $0 ≤ s ≤ L-1$.

Figure 6:
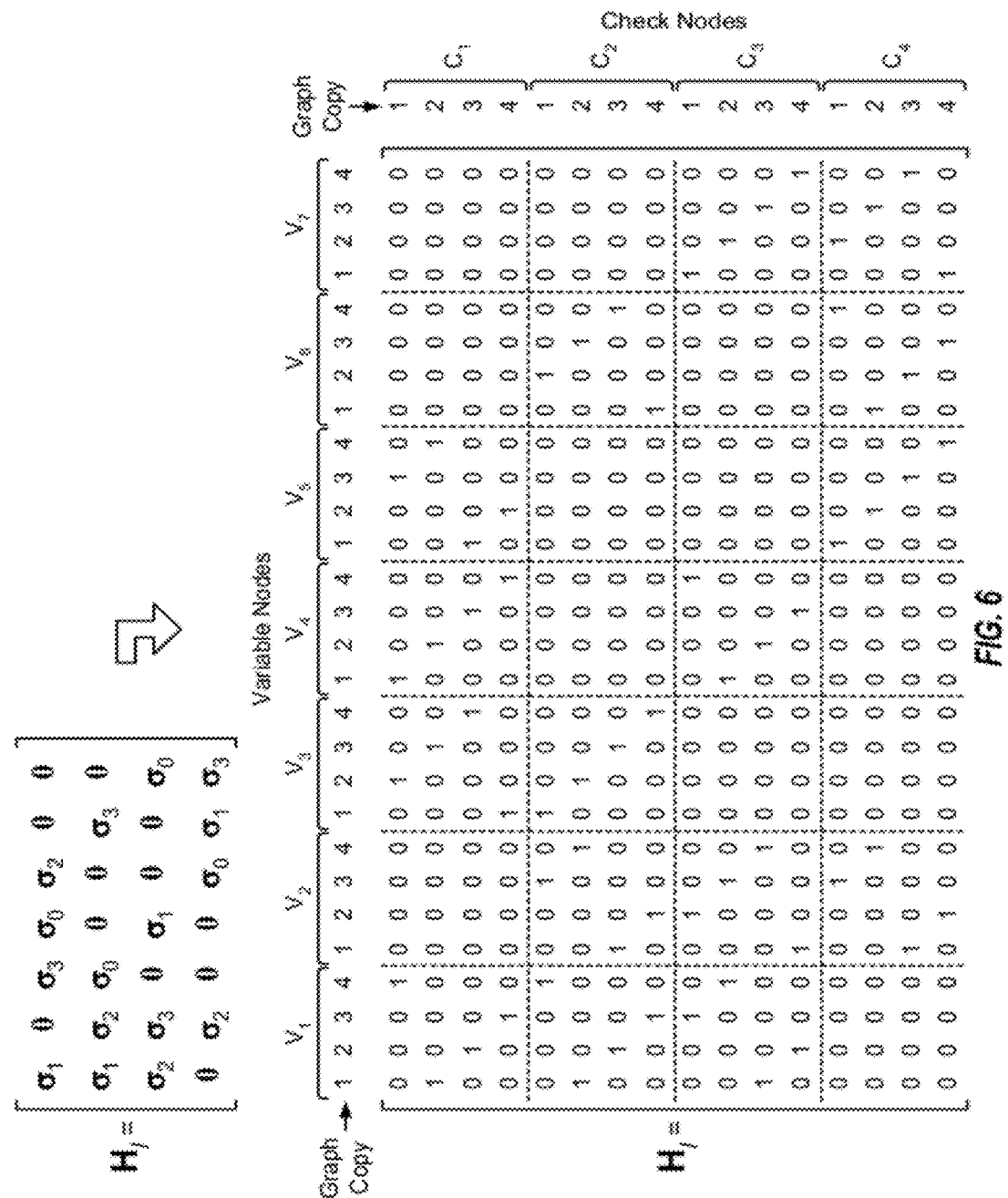
FIG. 6 shows a lifted parity check matrix.

FIG. 6 shows an example of the lifted parity check matrix $H_1$ in FIG. 4 with each of the 16 permutation matrices $σ_a$ through $σ_p$ being replaced with one of the four cyclic permutation matrices $σ_0$ through $σ_3$ shown in FIG. 5. The bottom of FIG. 6 shows the lifted parity check matrix $H_1$ with each cyclic permutation matrix being replaced with its corresponding 4×4 matrix of ones and zeros.

Replacing each non-zero element of the base parity check matrix $H_b$ with a 4×4 permutation matrix results in four copies of the base graph for the base LDPC code being generated. For a 4×4 permutation matrix corresponding to a given variable node $V_u$ and a given check node $C_v$, the four columns of this permutation matrix correspond to variable node $V_u$ in the four graph copies, and the four rows of this permutation matrix correspond to check node $C_v$ in the four graph copies. The 1s in the permutation matrix correspond to edges connecting variable node $V_u$ in the four graph copies to check node $C_v$ in the four graph copies. In particular, a 1 in column x of row y means that variable node $V_u$ in graph copy x is connected to check node $C_u$ in graph copy y. As an example, cyclic permutation matrix $σ_1$ is used for the non-zero element for variable node $V_1$ and check node $C_1$ in $H_1$. Matrix $σ_1$ includes a 1 in column 1 of row 2, which means that variable node $V_1$ in graph copy 1 is connected to check node $C_1$ in graph copy 2.

FIG. 7 shows a representation of a lifted parity check matrix $H_1$ generated based on the base parity check matrix $H_b$ shown in FIG. 3 with L=8. In this representation, an 8×16 grid 710 stores the edges for the seven variable nodes in all eight graph copies. Each row of grid 710 corresponds to one graph copy. The 16 boxes in each row correspond to the 16 edges a through p for the seven variable nodes in one graph copy. An 8×16 grid 720 stores the edges for the four check nodes in all eight graph copies. Each row of grid 720 corresponds to one graph copy. The 16 boxes in each row correspond to the 16 edges a through p for the four check nodes in one graph copy.

FIG. 7 also shows the connections between the eight copies of variable node $V_2$ and the eight copies of check node $C_2$ for edge d, which has cyclic permutation matrix $σ_3$ in this example. Thus, the eight copies of edge d are cyclically shifted down by three positions due to matrix $σ_3$. Each of the remaining edges may be cyclically shifted by a value within a range of 0 to 7 for L=8.

In general, a grid may include one column for each edge in the base parity check matrix and one row for each of the L graph copies. The L copies of each edge may be cyclically shifted by an amount determined by the cyclic permutation matrix for that edge.

FIGS. 3 through 6 show an example base LDPC code with the base parity check matrix $H_b$ shown in FIG. 3 and lifting of this base LDPC code to obtain a larger LDPC code with the lifted parity check matrix $H_1$ shown in FIG. 6. Lifting of different sizes may be achieved by using cyclic permutation matrices of different dimensions. The edges of the base parity check matrix $H_b$ may be cyclically shifted by a value within a range of 0 to L−1. The cyclic shift values for the edges of the base parity check matrix may be selected based on coding performance.

In one design, a set of six base LDPC codes may be defined for different values of $k_B$ ranging from 6 through 11. Table 1 lists various parameters of the six base LDPC codes in accordance with one design. In one design, the six base LDPC codes may be implemented as described in 3GPP2 C.S0084-001, entitled "Physical Layer for Ultra Mobile Broadband (UMB) Air Interface Specification," August 2007, which is publicly available. The base LDPC codes may also be implemented with other designs.

TABLE 1

| Code index i | Number of information bits $k_B$ | Number of parity bits $m_B$ | Number of code bits $n_B$ | Number of state variables $s_B$ | Base parity check matrix |
|---|---|---|---|---|---|
| 0 | 6 | 27 | 33 | 3 | $G_0$ |
| 1 | 7 | 31 | 38 | 3 | $G_1$ |
| 2 | 8 | 35 | 43 | 3 | $G_2$ |
| 3 | 9 | 39 | 48 | 3 | $G_3$ |
| 4 | 10 | 43 | 53 | 3 | $G_4$ |
| 5 | 11 | 47 | 58 | 3 | $G_5$ |

In one design, a set of nine lifting values of 4, 8, 16, 32, 64, 128, 256, 512 and 1024 may be supported. In this design, the smallest lifting value is $L_{min}=4$, and the largest lifting value is $L_{max}=1024$. These lifting values are different powers of two, which may provide certain advantages. A total of 54 different packet sizes ranging from 24 to 11,264 bits may be supported with the six base LDPC codes with $k_B$ ranging from 6 to 11 and the nine lifting values ranging from 4 to 1024. In general, any range of lifting values may be supported, and $L_{min}$ and $L_{max}$ may be any suitable values.

Table 2 gives parameters of base parity check matrix $G_0$ in accordance with one design. As shown in Table 1, $G_0$ has dimension of 27×33 and includes 27 rows with indices of 0 through 26 and 33 columns with indices of 0 through 32. For each row, the second column of Table 2 gives the row degree, which corresponds to the number of non-zero elements in the row. The third column of Table 2 gives the column positions of the non-zero elements in each row. The fourth column of Table 2 gives the cyclic shift value for each non-zero element in each row. For $L_{max}$=1024, the cyclic shift values are within a range of 0 to 1023. Example designs of base parity check matrices $G_1$ through $G_5$ are described in the aforementioned 3GPP2 C.S0084-001.

TABLE 2

Base Parity Check Matrix $G_0$

| Row Index | Row Degree | Column position of non-zero elements in row | Cyclic shift values of non-zero elements in row |
|---|---|---|---|
| 0 | 6 | 1, 2, 3, 4, 8, 9 | 110, 680, 424, 180, 0, 0 |
| 1 | 6 | 0, 2, 3, 6, 9, 10 | 702, 768, 863, 0, 0, 0 |
| 2 | 6 | 0, 1, 3, 4, 7, 10 | 360, 259, 652, 753, 0, 0 |
| 3 | 4 | 1, 4, 8, 20 | 402, 948, 0, 0 |
| 4 | 4 | 0, 5, 6, 20 | 318, 0, 767, 0 |
| 5 | 4 | 2, 5, 6, 7 | 154, 1023, 768, 0 |
| 6 | 3 | 0, 1, 11 | 885, 323, 0 |
| 7 | 3 | 0, 2, 12 | 617, 220, 0 |
| 8 | 4 | 1, 2, 3, 13 | 799, 519, 669, 0 |
| 9 | 4 | 0, 1, 4, 14 | 900, 72, 669, 0 |
| 10 | 4 | 0, 2, 6, 15 | 574, 253, 352, 0 |
| 11 | 4 | 1, 2, 7, 16 | 848, 280, 920, 0 |
| 12 | 4 | 0, 1, 5, 17 | 548, 928, 355, 0 |
| 13 | 4 | 0, 2, 3, 18 | 17, 376, 147, 0 |
| 14 | 4 | 0, 1, 4, 19 | 795, 823, 473, 0 |
| 15 | 4 | 0, 2, 8, 21 | 519, 424, 712, 0 |
| 16 | 3 | 1, 6, 22 | 952, 449, 0 |
| 17 | 3 | 2, 7, 23 | 887, 798, 0 |
| 18 | 4 | 0, 1, 9, 24 | 256, 93, 348, 0 |
| 19 | 3 | 2, 3, 25 | 492, 856, 0 |
| 20 | 4 | 1, 2, 10, 26 | 589, 1016, 705, 0 |
| 21 | 3 | 0, 4, 27 | 26, 166, 0 |
| 22 | 4 | 1, 2, 5, 28 | 525, 584, 845, 0 |
| 23 | 3 | 0, 8, 29 | 10, 331, 0 |
| 24 | 3 | 1, 9, 30 | 125, 310, 0 |
| 25 | 3 | 2, 10, 31 | 239, 641, 0 |
| 26 | 4 | 0, 1, 6, 32 | 557, 609, 448, 0 |

In one design, a base parity check matrix and a lifting value may be selected for a packet of size k as follows. First, a lifting value L may be selected based on the packet size k as follows:

$$L = 2^{\lceil \log_2(k/k_{B,max}) \rceil}, \quad \text{Eq (2)}$$

where $k_{B,max}$ is the maximum number of information bits for all base LDPC codes, and "⌈ ⌉" denotes a ceiling operator.

$k_{B,max}$=11 for the set of base LDPC codes shown in Table 1 but may be equal to other values for other sets of base LDPC codes.

A base parity check matrix may then be selected based on the packet size k and the selected lifting value L as follows:

$$k_B = \lceil k/L \rceil. \quad \text{Eq (3)}$$

The index of the selected base parity check matrix may be given as $i=k_B-6$. The selected base parity check matrix is denoted as G in the following description.

The selected base parity check matrix G and the selected lifting value L can encode up to $k_B \cdot L$ information bits and provide $n_B \cdot L$ code bits. The packet may be zero-padded to length $k_B \cdot L$ by appending $z_P = k_B \cdot L - k$ zeros at the end of the packet. The zero-padded packet may be encoded with the lifted parity check matrix to obtain $n_B \cdot L$ code bits. For an (n, k) code, the $z_P$ padded zeros as well as $n_B \cdot L - n - z_P$ parity bits may be punctured to obtain a codeword of n code bits.

To encode the packet, a lifted parity check matrix H may first be generated based on the selected base parity check matrix G and the selected lifting value L. The packet may then be encoded based on the lifted parity check matrix H.

To generate the lifted parity check matrix H, the cyclic shift value for each non-zero element of the selected base parity check matrix G may be determined as follows:

$$g' = \lfloor g \cdot L/L_{max} \rfloor, \quad \text{Eq (4)}$$

where g is a cyclic shift value for a non-zero element of G assuming lifting by $L_{max}$, and g' is a cyclic shift value for a non-zero element of G with lifting by L.

The fourth column of Table 2 gives the cyclic shift values for the non-zero elements of $G_0$ for $L_{max}$=1024. The cyclic shift values for the non-zero elements of other base parity check matrices may be generated and stored in similar tables. In general, the cyclic shift values for the non-zero elements of G may be generated for $L_{max}$ and may be used for all lifting values from $L_{min}$ to $L_{max}$. This may simplify design since only one set of cyclic shift values can be stored for G and used for all lifting values. Equation (4) essentially removes zero or more least significant bits (LSBs) of g to obtain g' for the selected lifting value L. For the design with $L_{max}$=1024, one LSB may be removed if L=512, two LSBs may be removed if L=256, etc. The removal of the LSBs may preserve the relationship between different shift parameters, e.g., s'=s+L/4 described below, which may simplify encoding. In another design, zero or more most significant bits (MSBs) of g may be removed by performing modulo-L operation to obtain g'. g' may also be obtained in other manners.

In one design, each non-zero element of G may be replaced with a cyclic permutation matrix $\sigma_{g'}$ to obtain the lifted parity check matrix H. $\sigma_{g'}$ may be obtained by cyclically shifting the identity matrix I by g'. In another design, each non-zero element of G may be replaced with a 2×2 matrix to obtain a matrix G'. This 2×2 matrix may be $$\begin{bmatrix} g'/2 & 0 \\ 0 & g'/2 \end{bmatrix}$$

if g' is an even value or $$\begin{bmatrix} 0 & (g'+1)/2 \\ (g'-1)/2 & 0 \end{bmatrix}$$

if g' is an odd value. Each non-zero element of G' may then be replaced with a cyclic permutation matrix that is cyclically shifted by g'/2, (g'-1)/2, or (g'+1)/2 to obtain the lifted parity check matrix H. H may also be generated based on G in other manners.

The columns and rows of the lifted parity check matrix H may be rearranged or permutated so that the resultant matrix has the following form:

$$H = \begin{bmatrix} M_1 & 0 \\ M_2 & I \end{bmatrix}, \quad \text{Eq (5)}$$

where $M_1$ is an M×N matrix, with $N=M+k_B \cdot L$, $M_2$ is an $(m_B \cdot L - M) \times N$ matrix, and 0 is an M x $(n_B \cdot L - N)$ matrix of all zeros.

The identity matrix in the lower right corner of H may be replaced with a lower triangular matrix, which may have non-zero elements below the diagonal.

The dimension of $M_1$ may be dependent on the selected base parity check matrix and may be a function of code index i. $M_1$ may have the following form:

$$M_1 = \begin{bmatrix} A & B & T \\ C & D & E \end{bmatrix}, \text{ with } \begin{bmatrix} B & T \\ D & E \end{bmatrix} \text{ being invertible,} \quad \text{Eq (6)}$$

where A is an $(M-L/2) \times (k_B \cdot L)$ matrix,
B is an $(M-L/2) \times (L/2)$ matrix,
C is an $(L/2) \times (k_B \cdot L)$ matrix,
D is an $(L/2) \times (L/2)$ matrix,
E is an $(L/2) \times (N-k_B \cdot L)$ matrix, and
T is an $(M-L/2) \times (M-L/2)$ lower triangular matrix having ones along the diagonal and zeros above the diagonal.

The constraints for the lifted LDPC code may be expressed as:

$$0 = Hx = \begin{bmatrix} M_1 & 0 \\ M_2 & I \end{bmatrix} \begin{bmatrix} x_1 \\ p_3 \end{bmatrix}, \text{ with } x = \begin{bmatrix} x_1 \\ p_3 \end{bmatrix}, \quad \text{Eq (7)}$$

where $x_1$ is an $N \times 1$ column vector of information bits and parity bits, and
$p_3$ is an $(n_B \cdot L - N) \times 1$ column vector of parity bits.

Because of the zero matrix 0 in the upper right corner of H in equation (5), a portion of equation (7) may be expressed as:

$$0 = M_1 x_1 = \begin{bmatrix} A & B & T \\ C & D & E \end{bmatrix} \begin{bmatrix} s \\ p_1 \\ p_2 \end{bmatrix}, \text{ with } x_1 = \begin{bmatrix} s \\ p_1 \\ p_2 \end{bmatrix}, \quad \text{Eq (8)}$$

where s is a $(k_B \cdot L) \times 1$ column vector of the information bits in the packet,
$p_1$ is an $(L/2) \times 1$ column vector of parity bits, and
$p_2$ is an $(M-L/2) \times 1$ column vector of parity bits.

$$Q = \begin{bmatrix} I & 0 \\ -ET^{-1} & I \end{bmatrix}$$

To solve for equation (8), $M_1$ may be pre-multiplied with as follows:

$$QM_1 = \begin{bmatrix} I & 0 \\ -ET^{-1} & I \end{bmatrix} \begin{bmatrix} A & B & T \\ C & D & E \end{bmatrix} = \begin{bmatrix} A & B & T \\ -ET^{-1}A+C & \phi & 0 \end{bmatrix}, \quad \text{Eq (9)}$$

where $\phi = -ET^{-1}B + D$.

Equations (8) and (9) may be combined to obtain:

$$As + Bp_1 + Tp_2 = 0, \text{ and} \quad \text{Eq (10)}$$

$$(-ET^{-1}A+C)s + \phi p_1 = 0. \quad \text{Eq (11)}$$

The parity bits $p_1$, $p_2$ and $p_3$ may then be computed as follows:

$$p_1 = -\phi^{-1}(-ET^{-1}A+C)s, \quad \text{Eq (12)}$$

$$p_2 = -T^{-1}(As + Bp_1), \text{ and} \quad \text{Eq (13)}$$

$$p_3 = -M_2 x_1, \quad \text{Eq (14)}$$

where $x_1$ includes s, $p_1$ and $p_2$ as shown in equation (8). If the identity matrix in the lower right corner of H is replaced with a lower triangular matrix, then equation (14) may be solved using (top down) back substitution.

The computation for $p_1$, $p_2$ and $p_3$ may be simplified by performing the matrix multiplication in equations (12) and (13) in steps, storing intermediate results, and using the intermediate results for later steps.

The lifted parity check matrix H is for the lowest code rate, which may be given as $r = k_B/n_B$. H may be punctured to obtain higher rates. The LDPC codes are structured as an inner "core" LDPC code of high rate with outer parity bits. The encoding may be performed in a sequential manner to obtain the desired number of code bits. For example, parity bits $p_1$ may be computed first as shown in equation (12), then parity bits $p_2$ may be computed next (if needed) as shown in equation (13), and then parity bits $p_3$ may be computed last (if needed) as shown in equation (14).

The system may support hybrid automatic retransmission (HARQ). For HARQ, a transmitter may send a first transmission of a packet to a receiver and may thereafter send one or more additional transmissions (or retransmissions) if needed until the packet is decoded correctly by the receiver, or the maximum number of transmissions has been sent, or some other termination condition is encountered. HARQ may improve reliability of data transmission. For each base LDPC code, a sequence of HARQ extensions may be generated to span all code rates supported by the system. The HARQ extensions may be defined by puncturing parity bits. Most of the puncturing may be in the third parity bits $P_3$ but some of the puncturing may be in the second parity bits $P_2$.

Figure 8:
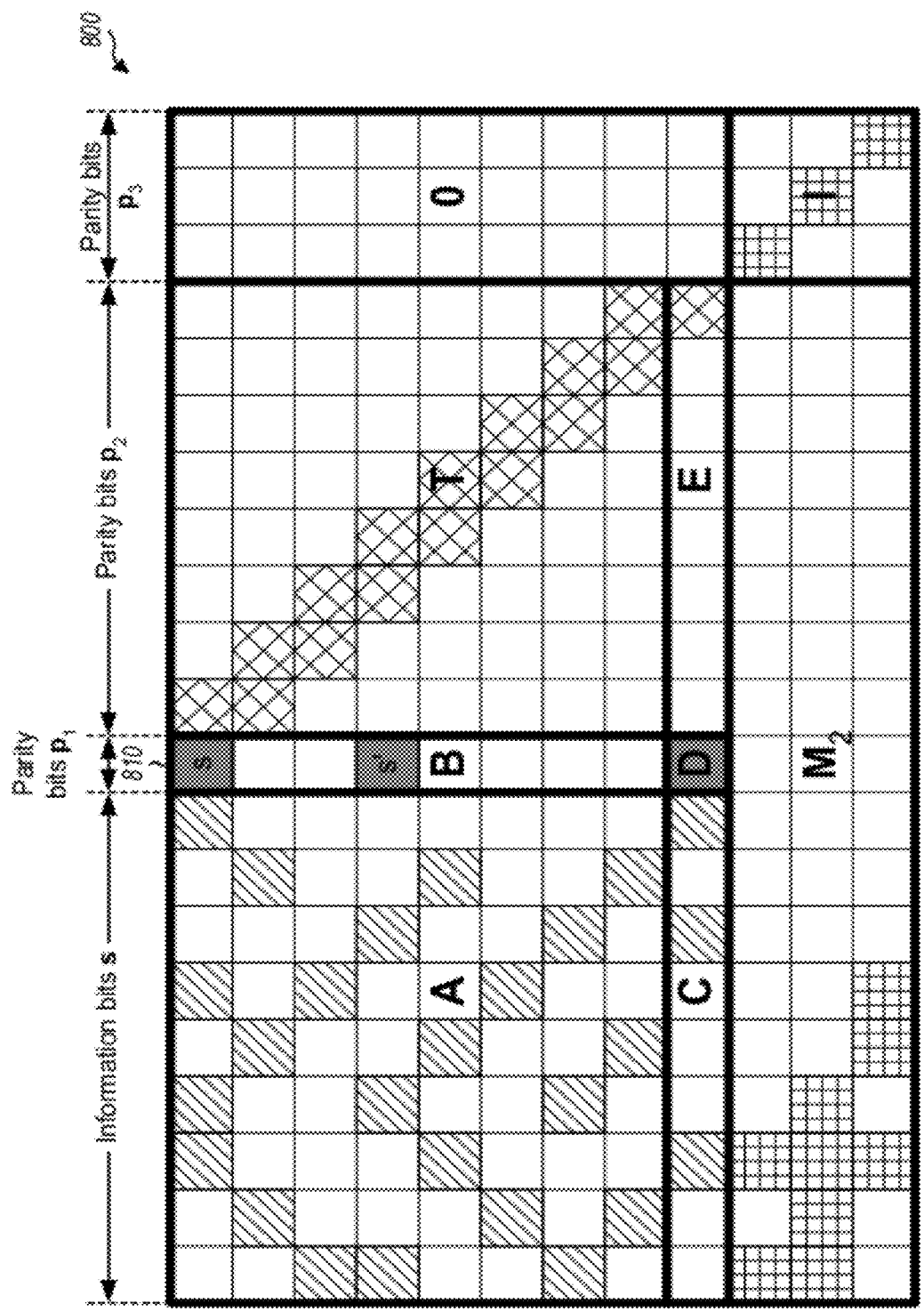
FIG. 8 shows a graph for a lifted parity check matrix.

FIG. 8 shows a base graph 800 of a base parity check matrix G, which may have the form shown in equations (5) and (6). Graph 800 is used only for illustration and does not match any of the base parity check matrices described above. Base graph 800 includes a number of square boxes, with each square box representing an element in the base parity check matrix. Each non-zero element of the base parity check matrix is represented by a marked box. Each marked box is associated with a cyclic shift value that determines the amount of cyclic shift for the L edge copies obtained by lifting the base parity check matrix by a lifting value of L.

A codeword is composed of information bits and parity bits along the top of the graph 800. The bits in the codeword may be transmitted starting from the left and moving to the right, except for some re-ordering of the parity columns.

Base graph 800 comprises information bits s, first parity bits $p_1$, second parity bits $p_2$, and third parity bits $p_3$ along the top of the base graph. The first parity bits are associated with a first set of constraints, the second parity bits are associated with a second set of constraints, and the third parity bits are associated with a third set of constraints. The core portion of base graph 800 consists of the variable nodes representing the information bits and the first and second parity bits and the constraint nodes representing the first and second sets of constraints. The core portion typically contains no variable nodes of degree 1. The third parity bits and the constraints of the third set of constraints (or third parity constraints) are in one-to-one correspondence with each other, which is shown by the identity matrix in the lower right corner of base graph 800. The third parity bits and the third parity constraints may be linearly ordered so that each third parity bit can be determined as a parity of information bits, first parity bits, second parity bits, and preceding third parity bits. A third parity constraint node associated with a third parity bit by the one-to-one correspondence is connected by edges to a variable node of the third parity bit as well as variable nodes representing the bits of which this third parity bit is a parity bit.

The design shown in FIG. 8 includes several features that may simplify encoding. The variable nodes of the first and second parity bits are either degree 2 or degree 3. To simplify encoding, one first parity bit may be associated with one variable node of degree 3, and the second parity bits may be associated with variable nodes of degree 2. The degree 3 variable node is shown by column 810 for matrices B and D, which includes three shaded square boxes for three non-zero elements. The degree 2 variable nodes may be configured in an accumulate chain structure, which is also known as a dual-diagonal structure. This dual-diagonal structure is shown by the triangular matrix T having two stacked marked boxes in each column of T. The dual-diagonal structure may have significance in code performance and encoding. Having a large number of degree 2 variable nodes may improve performance, and having the degree 2 variable nodes in the dual-diagonal form nearly saturates this possibility. The dual-diagonal structure also allows the degree 2 variable nodes to be easily recursively encoded, much like a convolutional code. When properly ordered, the H matrix structure may be include sub-matrix T with only the diagonal (1,1), (2,2), etc., as well as the sub diagonal (2,1), (3,2), etc., containing non-zero elements. Often, the edges corresponding to the dual-diagonal structure are given lifting value 0, meaning no permutation, forming L separate chains in the lifted graph.

Two of the edges of the degree 3 variable node may connect in the base graph so as to close a loop in a graph associated with the dual-diagonal structure. To simplify encoding in this situation, the lifting values for the three edges of the degree 3 variable node may be of the form x, s, s'=(s+L/m) mod L, where m is power of 2, and x and s may be arbitrary values. When all cyclic shifts are reversed, the code is unchanged because this amounts to reversing the order of the constraint nodes in a lifting. Thus, lifting values of the form x, s, s'=(s−L/m) mod L may also be used. Encoding may be simplified because the matrix $\phi=-ET^{-1}B+D$ can be factored with low degree factors and is itself of low weight.

The cyclic shift values for two non-zero elements of the degree 3 variable node may be s and s', where s may be an arbitrarily selected value and s' may be selected in several manners. In a first design, s'=s and $\phi^{-1}$ is a permutation matrix. For this design, the lifted LDPC code has a loop passing through the length of the base graph accumulator chain (degree 2 nodes) and one degree 3 node. The loop occurs with multiplicity L, which may result in suboptimal error floor performance, especially since the base graph has a short accumulator chain. In another design, s'=s+L/2 and $\phi^{-1}$ is a sum of three permutation matrices. For this design, the corresponding loop in the lifted LDPC code passes through the length of the base graph accumulator chain (degree 2 nodes) and two degree 3 nodes. The complexity of multiplication by $\phi^{-1}$ may still be small. However, this design may still be susceptible to some error floors. In a third design, s'=s+L/4 and $\phi^{-1}$ is a sum of nine permutation matrices. The corresponding loop in the lifted LDPC code passes through the length of the base graph accumulator chain (degree 2 nodes) and four degree 3 nodes. The complexity of multiplication by $\phi^{-1}$ may still be small since $\phi^{-1}$ may still be a sparse matrix. This design may simplify encoding while avoiding problems associated with error floors. The cyclic shift value for the third non-zero element may be x, which may be another arbitrarily selected value.

The techniques described herein may be used to support a wide range of packet sizes. A suitable packet size may be selected based on various factors such as channel conditions (which may be given by spectral efficiency or packet format), amount of assigned resources, pilot overhead, MIMO rank, etc. The techniques allow for generation of good rate-compatible codes for any values of k and n using a small number of base LDPC codes.

The lifted LDPC codes described herein may enable parallel encoder and decoder implementations in various forms. For an edge-parallel decoder implementation, the edges in the base graph may be processed in a serial fashion, and parallelism may be achieved by simultaneously processing L copies of the same edge. For a node-parallel decoder implementation, different copies of the base graph may be processed in a serial fashion, and parallelism may be achieved by simultaneously processing different nodes in the base graph. By using cyclic permutation matrices with sizes restricted to powers of two, the lifting may be easily implemented using a counting operation, especially for the node-parallel implementation. The counting operation refers to walking through an L-cycle by counting from x to x+1 mod L. This restriction on the lifting size may ensure that all of the different lifting sizes have a large common factor, which may be an important property for an edge-parallel decoder implementation. The LDPC code structure described herein may support both efficient node-parallel and edge-parallel decoder implementations. Furthermore, the graph descriptions are compact and provide fundamental complexity reduction.

Figure 9:
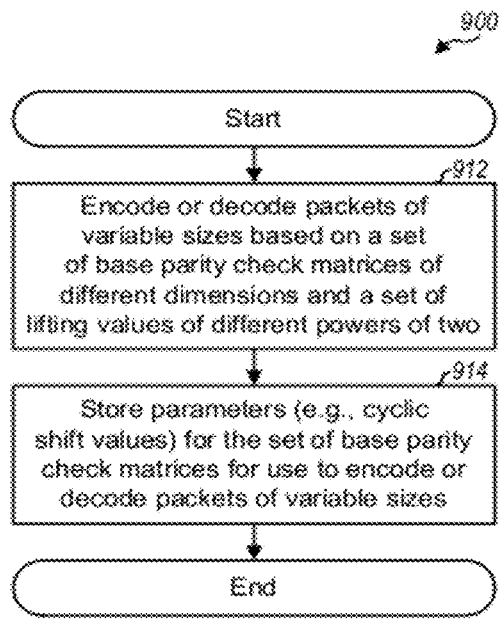
FIG. 9 shows a process for processing data.

FIG. 9 shows a design of a process 900 for processing data. Process 900 may be performed by a base station, a terminal, or some other entity. Packets of variable sizes may be encoded or decoded based on a set of base parity check matrices of different dimensions and a set of lifting values of different powers of two (block 912). The set of base parity check matrices may comprise base parity check matrices for 6, 7, 8, 9, 10 and 11 information bits, as described above, for $k_B$ to $2k_B-1$ information bits, for $k_B+1$ to $2k_B$ information bits, or for some other range of information bits. The set of base parity check matrices may also include some other combination of base parity check matrices. The set of lifting values may comprise lifting values for 4, 8, 16, 32, 64, 128, 256, 512 and 1024, as described above, or some other range or combination of lifting values. Parameters (e.g., cyclic shift values) for the set of base parity check matrices may be stored for use to encode or decode packets of variable sizes (block 914). Each base parity check matrix may comprise a plurality of non-zero elements at a plurality of locations. Each non-zero element may be associated with a cyclic shift value within a range of 0 to $L_{max}-1$, where $L_{max}$ is a maximum lifting value. A plurality of cyclic shift values may be stored for the plurality of non-zero elements of each base parity check matrix. The cyclic shift values for all lifting values for each base parity check matrix may be determined based on the cyclic shift values stored for that base parity check matrix.

Figure 10:
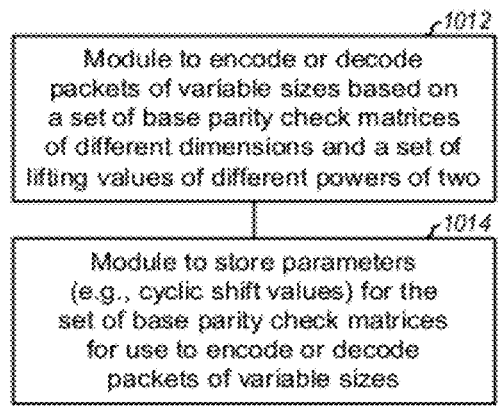
FIG. 10 shows an apparatus for processing data.

FIG. 10 shows a design of an apparatus 1000 for processing data. Apparatus 1000 includes means for encoding or decoding packets of variable sizes based on a set of base parity check matrices of different dimensions and a set of lifting values of different powers of two (module 1012), and means for storing parameters (e.g., cyclic shift values) for the set of base parity check matrices (block 1014).

Figure 11:
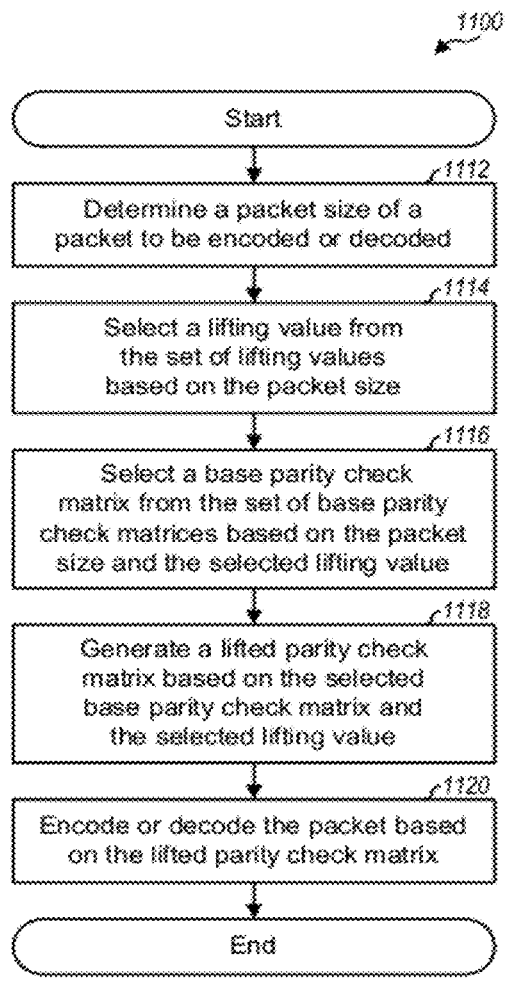
FIG. 11 shows a process for processing a packet.

FIG. 11 shows a design of a process 1100 for processing a packet, which may be used for block 912 in FIG. 9. A packet size of a packet to be encoded or decoded may be determined (block 1112). A lifting value may be selected from the set of lifting values based on the packet size, e.g., as shown in equation (2) (block 1114). A base parity check matrix may be selected from the set of base parity check matrices based on the packet size and the selected lifting value, e.g., as shown in equation (3) (block 1116). A lifted parity check matrix may be generated based on the selected base parity check matrix and the selected lifting value (block 1118). The packet may be encoded or decoded based on the lifted parity check matrix (block 1120).

For block 1118, the lifted parity check matrix may be generated based further on cyclic shift values for non-zero elements of the selected base parity check matrix. Cyclic shift values for the lifted parity check matrix may be computed based on the cyclic shift values for the non-zero elements of the selected base parity check matrix and the selected lifting value, e.g., as shown in equation (4). The lifted parity check matrix may then be generated by replacing each non-zero element of the selected base parity check matrix with a cyclic permutation matrix of a cyclic shift value computed for that non-zero element.

For encoding in block 1120, information bits in the packet may be encoded based on the lifted parity check matrix to obtain first parity bits, e.g., as shown in equation (12). The information bits and the first parity bits may be encoded based on the lifted parity check matrix to obtain second parity bits, e.g., as shown in equation (13). The information bits, the first parity bits, and the second parity bits may be encoded based on the lifted parity check matrix to obtain third parity bits, e.g., as shown in equation (14).

For decoding in block 1120, a large graph for the lifted parity check matrix may be generated based on L copies of a base graph for the selected base parity check matrix, where L is the selected lifting value. The nodes of the L copies of the base graph may be interconnected based on permutation matrices for the non-zero elements of the selected base parity check matrix. The base graph may comprise a plurality of edges for the non-zero elements of the selected base parity check matrix. For edge-parallel decoding, decoding may be performed in parallel for the L copies of same edge in the L copies of the base graph and may be performed sequentially for different edges in the L copies of the base graph. For node-parallel decoding, decoding may be performed in parallel for the nodes of each copy of the graph and may be performed sequentially for the L copies of the base graph.

Figure 12:
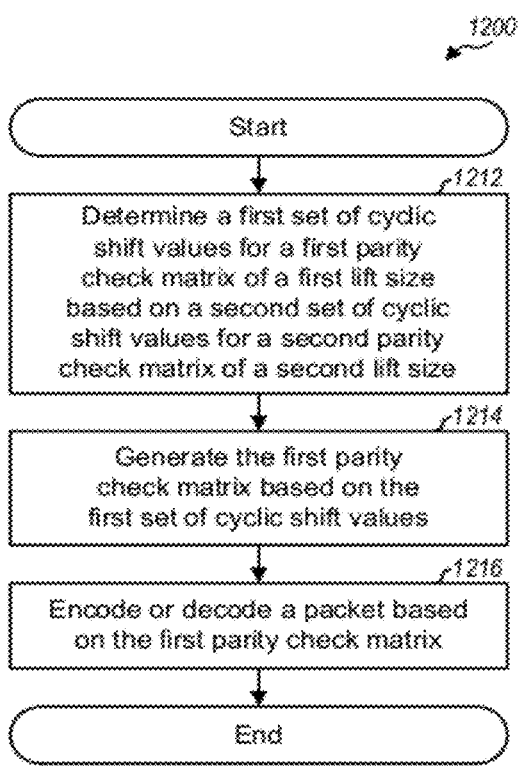
FIG. 12 shows another process for processing a packet.

FIG. 12 shows a design of a process 1200 for processing a packet. A first set of cyclic shift values for a first parity check matrix of a first lift size may be determined based on a second set of cyclic shift values for a second parity check matrix of a second lift size (block 1212). The first and second lift sizes may be different powers of two. In one design of block 1212, a factor K may be determined based on a ratio of the second lift size to the first lift size, and K LSBs of each cyclic shift value in the second set may be removed to obtain a corresponding cyclic shift value in the first set. This may be achieved by dividing each cyclic shift value in the second set by the ratio and rounding down to an integer value to obtain a corresponding cyclic shift value in the first set, as shown in equation (4). In another design of block 1212, K MSBs of each cyclic shift value in the second set may be removed to obtain a corresponding cyclic shift value in the first set.

The first parity check matrix may be generated based on the first set of cyclic shift values (block 1214). This may be achieved by replacing each non-zero element of a base parity check matrix with a cyclic permutation matrix of a cyclic shift value in the first set corresponding to that non-zero element. A packet may be encoded or decoded based on the first parity check matrix (block 1216).

Figure 13:
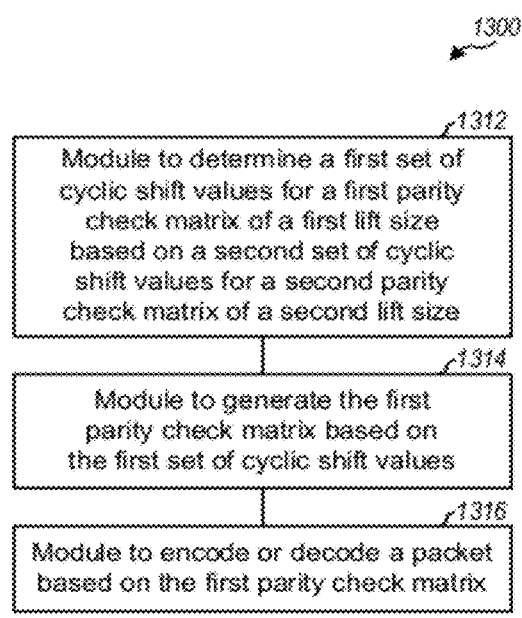
FIG. 13 shows an apparatus for processing a packet.

FIG. 13 shows a design of an apparatus 1300 for processing a packet. Apparatus 1300 includes means for determining a first set of cyclic shift values for a first parity check matrix of a first lift size based on a second set of cyclic shift values for a second parity check matrix of a second lift size (module 1312), means for generating the first parity check matrix based on the first set of cyclic shift values (module 1314), and means for encoding or decoding a packet based on the first parity check matrix (module 1316).

Figure 14:
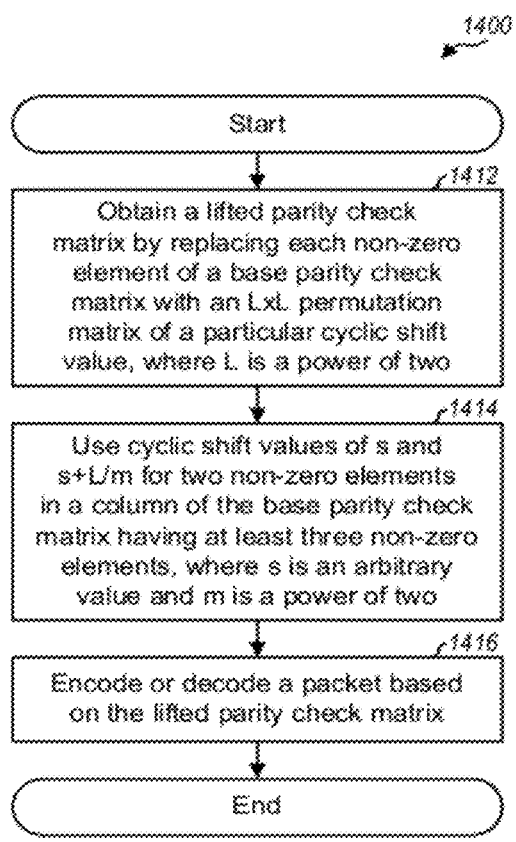
FIG. 14 shows yet another process for processing a packet.

FIG. 14 shows a design of a process 1400 for processing a packet. A lifted parity check matrix may be obtained by replacing each non-zero element of a base parity check matrix with an L×L permutation matrix of a particular cyclic shift value, where L is a power of two (block 1412). Cyclic shift values of s and s+L/m may be used for two non-zero elements in a column of the base parity check matrix having at least three non-zero elements, where s is an arbitrary value and m is a power of two (block 1414). In one design, m is equal to two, and the cyclic shift values for the two non-zero elements are s and s+L/2. In another design, m is equal to four, and the cyclic shift values for the two non-zero elements are s and s+L/4. In yet another design, m is equal to eight, and the cyclic shift values for the two non-zero elements are and s+L/8. m may also be equal to other values. A cyclic shift value of x may be selected for a third non-zero element in the column having at least three non-zero elements. The base parity check matrix may comprise a submatrix $$\begin{bmatrix} B & T \\ D & E \end{bmatrix},$$

where T is a lower triangular matrix, matrices B and D each has a width of 1, matrices D and E each has a height of 1, and the at least three non-zero elements are in a column corresponding to matrices B and D. A packet may be encoded or decoded based on the lifted parity check matrix (block 1416).

Figure 15:
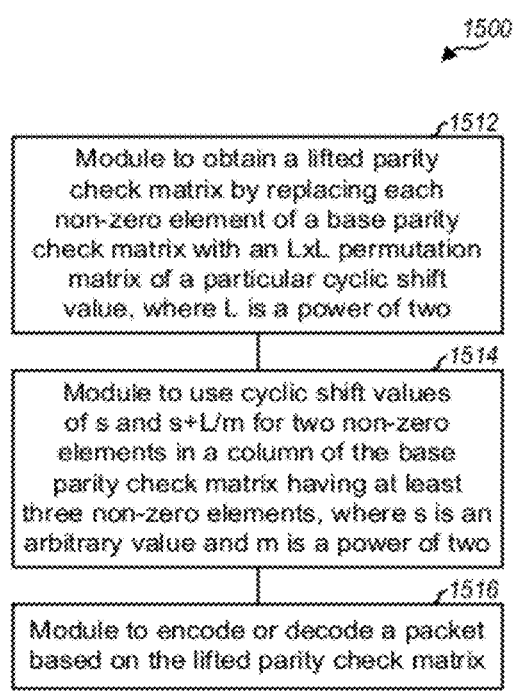
FIG. 15 shows another apparatus for processing a packet.

FIG. 15 shows a design of an apparatus 1500 for processing a packet. Apparatus 1500 includes means for obtaining a lifted parity check matrix by replacing each non-zero element of a base parity check matrix with an L×L permutation matrix of a particular cyclic shift value, where L is a power of two (module 1512), means for using cyclic shift values of s and s+L/m for two non-zero elements in a column of the base parity check matrix having at least three non-zero elements, where s is an arbitrary value and m is a power of two (module 1514), and means for encoding or decoding a packet based on the lifted parity check matrix (module 1516).

The modules in FIGS. 10, 13 and 15 may comprise processors, electronics devices, hardware devices, electronics components, logical circuits, memories, etc., or any combination thereof.

The techniques described herein may be implemented by various means. For example, these techniques may be implemented in hardware, firmware, software, or a combination thereof. For a hardware implementation, the processing units used to perform the techniques at an entity (e.g., a Node B or a terminal) may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with code (e.g., procedures, functions, modules, instructions, etc.) that performs the functions described herein. In general, any computer/processor-readable medium tangibly embodying firmware and/or software code may be used in implementing the techniques described herein. For example, the firmware and/or software code may be stored in a memory (e.g., memory 232 or 272 in FIG. 2) and executed by a processor (e.g., processor 230 or 270). The memory may be implemented within the processor or external to the processor. The firmware and/or software code may also be stored in a computer/processor-readable medium such as random access memory (RAM), read-only memory (ROM), non-volatile random access memory (NVRAM), programmable read-only memory (PROM), electrically erasable PROM (EEPROM), FLASH memory, floppy disk, compact disc (CD), digital versatile disc (DVD), magnetic or optical data storage device, etc. The code may be executable by one or more computers/processors and may cause the computer/processor(s) to perform certain aspects of the functionality described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. An apparatus comprising:
   at least one processor configured to:
   select a lifting value from a set of lifting values based on a packet size of a packet to be encoded or decoded; and
   encode or decode the packet based on a base parity check matrix and the selected lifting value, wherein the set of lifting values is limited to lifting values that are each a different power of two; and
   a memory coupled to the at least one processor and configured to store parameters associated with the base parity check matrix.

2. The apparatus of claim 1, wherein the set of lifting values comprises a plurality of lifting values selected from the group of 4, 8, 16, 32, 64, 128, 256, 512 and 1024.

3. The apparatus of claim 1, wherein the set of lifting values includes nine different lifting values.

4. The apparatus of claim 1, wherein the at least one processor is configured to:
   determine the packet size of the packet to be encoded or decoded,
   generate a lifted parity check matrix based on the base parity check matrix and the selected lifting value, and
   encode or decode the packet based on the lifted parity check matrix.

5. The apparatus of claim 4, wherein the at least one processor is configured to generate the lifted parity check matrix based further on cyclic shift values for non-zero elements of the base parity check matrix.

6. The apparatus of claim 1, wherein in the at least one processor is further configured to generate a lifted parity check matrix corresponding to the base parity check matrix and the selected lifting value using cyclic shift values of s and s+L/4 for two non-zero elements in a column of the base parity check matrix, wherein the column includes at least three non-zero elements, and wherein s is an arbitrary value and L is the selected lifting value.

7. The apparatus of claim 1, wherein the lifting value is further selected based on a number of information bits of the base parity check matrix.

8. The apparatus of claim 1, wherein the at least one processor is further configured to select the base parity matrix from a plurality of base parity matrices based on the selected lifted value.

9. A method comprising:
   selecting a lifting value from a set of lifting values based on a packet size of a packet to be encoded or decoded; and
   encoding or decoding the packet based on a base parity check matrix and the selected lifting value, wherein the set of lifting values is limited to lifting values that are each a different power of two.

10. The method of claim 9, wherein the set of lifting values includes 4, 8, 16, 32, 64, 128, 256, 512 and 1024.

11. The method of claim 9, further comprising selecting the base parity check matrix from a set of base parity check matrices based at least in part on the packet.

12. The method of claim 9, wherein the base parity check matrix comprises $$\begin{bmatrix} M1 & 0 \\ M2 & I \end{bmatrix},$$

wherein 0 is a matrix of all zeros, wherein I is an identity matrix, wherein a width of a matrix M1 and a matrix M2 is based on a number of information bits and parity bits, and wherein the matrix M1 comprises $$\begin{bmatrix} A & B & T \\ C & D & E \end{bmatrix},$$

wherein a number of columns of the matrix A corresponds to a number of information bits, and wherein dimensions of the matrix M2 depend on the matrix M1.

13. The method of claim 12, wherein T is a lower triangular matrix, wherein each of a matrix B and a matrix D has a width of one, and wherein each of the matrix D and a matrix E has a height of one.

14. An apparatus comprising:
   means for determining a packet size of a packet to be encoded or decoded;
   means for selecting a lifting value from a set of lifting values based on the packet size of the packet; and
   means for encoding or decoding the packet based on a lifted base parity check matrix, the lifted base parity check matrix generated based on a single cyclic lifting operation using a lifting value and performed on a base parity check matrix, wherein the lifting value is included in a set of lifting values that are each a different power of two.

15. The apparatus of claim 14, wherein at least three lifting values of the set of lifting values include at least two lifting values greater than 32.

16. The apparatus of claim 14, further comprising means for selecting the base parity check matrix from a set of base parity check matrices based at least in part on the selected lifting value.

17. A non-transitory computer-readable medium comprising computer-executable instructions that, when executed by a computer, cause the computer to:
   select a lifting value from a set of lifting values based on a packet size of a packet to be encoded or decoded; and
   encode or decode the packet based on a lifted base parity check matrix, the lifted base parity check matrix generated based on a single cyclic lifting operation using the lifting value and performed on a base parity check matrix, wherein the set of lifting values are each a different power of two.

18. The non-transitory computer-readable medium of claim 17, wherein a first lifting value of the set of lifting values is greater than 128.

19. The non-transitory computer-readable medium of claim 18, wherein the first lifting value is 512.

20. The non-transitory computer-readable medium of claim 17, further comprising computer-executable instructions that, when executed by the computer, cause the computer to:
determine the packet size of the packet to be encoded or decoded, and
generate the lifted parity check matrix based on the base parity check matrix and the selected lifting value.

21. The non-transitory computer-readable medium of claim 20, further comprising computer-executable instructions that, when executed by the computer, cause the computer to generate the lifted parity check matrix based further on cyclic shift values for non-zero elements of the base parity check matrix.

22. An apparatus comprising:
means for determining a packet size of a packet to be encoded or decoded;
means for selecting a lifting value from a set of lifting values based on the packet size of the packet; and
means for encoding or decoding the packet based on a base parity check matrix and the lifting value, wherein the set of lifting values is limited to lifting values that are each a different power of two, and wherein each lifting value of the set of lifting values is associated with a lifting operation to generate a corresponding lifted base parity check matrix.

23. The apparatus of claim 22, further comprising:
means for storing parameters associated with a base parity check matrix, wherein the base parity check matrix comprises $$\begin{bmatrix} M1 & 0 \\ M2 & I \end{bmatrix},$$

wherein 0 is a matrix of all zeros, wherein I is an identity matrix, wherein a width of a matrix M1 and a width of a matrix M2 are based on a number of information bits and a number of parity bits, wherein the matrix M1 comprises $$\begin{bmatrix} A & B & T \\ C & D & E \end{bmatrix},$$

wherein the width of a matrix A corresponds to the number of information bits in the packet, and wherein dimensions of the matrix M2 depend on the matrix M1.

24. The apparatus of claim 23, wherein T is a lower triangular matrix, wherein each of a matrix B and a matrix D has a width of one, and wherein each of a matrix C, the matrix D, and a matrix E has a height of one.

25. The apparatus of claim 22, further comprising means for obtaining a lifted parity check matrix by replacing each non-zero element of the base parity check matrix with an L×L permutation matrix of a particular cyclic shift value, and wherein L is a power of two.

26. A non-transitory computer-readable medium comprising computer-executable instructions that, when executed by a computer, cause the computer to:
select a particular lifting value from a set from lifting values;
select a base parity check matrix from a set of base parity check matrices based on the particular lifting value; and
encode or decode a packet based on the base parity check matrix and the particular lifting value, wherein the set of lifting values is limited to lifting values that are each a different power of two, and wherein each lifting value of the set of lifting values is associated with a lifting operation to generate a corresponding lifted base parity check matrix.

27. The non-transitory computer-readable medium of claim 26, further comprising computer-executable instructions that, when executed by the computer, cause the computer to:
store parameters associated with a base parity check matrix, wherein the base parity check matrix includes at least $$\begin{bmatrix} B & T \\ D & E \end{bmatrix},$$

wherein T is a lower triangular matrix, wherein each of a matrix B and a matrix D has a width of one, and wherein each of the matrix D and a matrix E has a height of one.

28. The non-transitory computer-readable medium of claim 27, further comprising computer-executable instructions that, when executed by the computer, cause the computer to encode or decode the packet based on a lifted parity check matrix obtained from the base parity check matrix.

29. The non-transitory computer-readable medium of claim 27, wherein the base parity matrix further includes a matrix M1, wherein the matrix M1 comprises $$\begin{bmatrix} A & B & T \\ C & D & E \end{bmatrix},$$

wherein a number of columns of the matrix A corresponds to a number of information bits, and wherein C is a matrix with a height of one.

30. The non-transitory computer-readable medium of claim 29, wherein the base parity check matrix comprises $$\begin{bmatrix} M1 & 0 \\ M2 & I \end{bmatrix},$$

wherein I is an identity matrix, wherein 0 is a matrix of all zeros, wherein the matrix M1 includes first dimensions dependent on the base parity matrix, and wherein a matrix M2 includes second dimensions dependent on the matrix M1, and wherein a width of the matrix M1 and the matrix M2 is based on a number of information bits and parity bits.

31. The non-transitory computer-readable medium of claim 26, wherein the particular lifting value is selected based on a maximum number of information bits for the set of base parity check matrices, and wherein the base parity check matrix is further selected based on a packet size of the packet.

32. The non-transitory computer-readable medium of claim 26, wherein the particular lifting value is selected from the set of lifting values based on computing $$L = 2^{\lceil \log_2(k/k_{B,max}) \rceil},$$

where k is a packet size of the packet to be encoded or decoded, $k_{B,max}$ is a maximum number of information bits for the set of base parity check matrices, L is the particular lifting value, and "$\lceil \ \rceil$" denotes a ceiling operator.

33. The non-transitory computer-readable medium of claim 26, wherein the base parity check matrix is selected by computing $$k_B = \lceil k/L \rceil,$$

where k is a packet size of the packet to be encoded or decoded, L is the particular lifting value, $k_B$ is a number of information bits for the selected base parity check matrix, and "$\lceil \ \rceil$" denotes a ceiling operator.

34. An apparatus comprising:
at least one processor configured to encode or decode a packet based on a lifted base parity check matrix, the lifted base parity check matrix generated based on a single cyclic lifting operation using a lifting value and performed on a base parity check matrix, wherein the lifting value is included in a set of lifting values that are each a different power of two, and wherein the lifting value is selected from the set of lifting values based on a packet size of the packet; and
a memory coupled to the at least one processor and configured to store parameters associated with the base parity check matrix.

35. The apparatus of claim 34, further comprising:
a memory configured to store parameters associated with a base parity check matrix, wherein the base parity check matrix comprises $$\begin{bmatrix} M1 & 0 \\ M2 & I \end{bmatrix},$$

wherein 0 is a matrix of all zeros, wherein I is an identity matrix, wherein a width of a matrix M1 and a width of a matrix M2 are based on a number of information bits and a number of parity bits, wherein the matrix M1 comprises $$\begin{bmatrix} A & B & T \\ C & D & E \end{bmatrix},$$

wherein the width of a matrix A corresponds to the number of information bits in the packet, and wherein dimensions of the matrix M2 depend on the matrix M1.

36. The apparatus of claim 35, wherein T is a lower triangular matrix, wherein each of a matrix B and a matrix D has a width of one, and wherein each of a matrix C, the matrix D, and a matrix E has a height of one.

37. The apparatus of claim 35, wherein the at least one processor is further configured to obtain a lifted parity check matrix by replacing each non-zero element of the base parity check matrix with an L×L permutation matrix of a particular cyclic shift value, and wherein L is a power of two.

38. A method comprising:
encoding or decoding a packet based on a lifted base parity check matrix, the lifted base parity check matrix generated based on a single cyclic lifting operation using a lifting value and performed on a base parity check matrix, wherein the lifting value is included in a set of lifting values that are each a different power of two, and wherein the lifting value is selected from the set of lifting values based on a packet size of the packet.

39. The method of claim 38, further comprising:
storing parameters associated with a base parity check matrix, wherein the base parity check matrix comprises $$\begin{bmatrix} M1 & 0 \\ M2 & I \end{bmatrix},$$

wherein 0 is a matrix of all zeros, wherein I is an identity matrix, wherein a width of a matrix M1 and a matrix M2 is based on a number of information bits and parity bits, wherein the matrix M1 comprises $$\begin{bmatrix} A & B & T \\ C & D & E \end{bmatrix},$$

wherein a width of a matrix A corresponds to a number of information bits in the packet, and wherein dimensions of the matrix M2 depend on the matrix M1.

40. The method of claim 39, wherein T is a lower triangular matrix, wherein each of a matrix B and a matrix D has a width of one, and wherein each of a matrix C, and the matrix D, and a matrix E has a height of one.

41. The method of claim 40, further comprising using cyclic shift values of s and s+L/m for two non-zero elements in a column of the base parity check matrix, wherein s is an arbitrary value, wherein m is a power of two, and wherein the column having at least three non-zero elements of the base parity check matrix corresponds to the matrix B and the matrix D.

42. The method of claim 41, wherein m is equal to one of two, four, and eight.

* * * * *